Jan. 19, 1965 VO DINH HIEN 3,166,714

MANUAL TUNING CONTROL SYSTEM FOR FM RADIO RECEIVERS WITH AFC

Filed Oct. 9, 1962 2 Sheets-Sheet 1

INVENTOR.
VO DINH HIEN
BY
Eugene M. Whitacre
Attorney

MANUAL TUNING CONTROL SYSTEM FOR FM RADIO RECEIVERS WITH AFC

Filed Oct. 9, 1962 2 Sheets-Sheet 2

INVENTOR.
VO DINH HIEN
BY Eugene M. Whitacre
Attorney

United States Patent Office 3,166,714
Patented Jan. 19, 1965

3,166,714
MANUAL TUNING CONTROL SYSTEM FOR FM RADIO RECEIVERS WITH AFC

Vo Dinh Hien, Indianapolis, Ind., assignor to Radio Corporation of America, a corporation of Delaware
Filed Oct. 9, 1962, Ser. No. 229,359
7 Claims. (Cl. 325—457)

The present invention relates to manual tuning control systems for radio receivers and the like, and more particularly to tuning control systems of this type for FM radio receivers with automatic frequency control, such as frequency-modulation (FM) receivers for signal reception in the present FM broadcast band.

Many modern frequency-modulation radio receivers for commercial broadcast-band reception are equipped with automatic-frequency-control (AFC) means which operates to maintain the tuning setting substantially free of drift from any selected signal over a wide period of operation. As is understood, it is desirable to first tune a frequency-modulation receiver to a desired signal or station without automatic frequency control, thereby to adjust the receiver accurately to the signal frequency. It is then desirable to apply the automatic frequency control to maintain the tuning at the desired frequency, and this generally is accomplished by switching on an AFC circuit in the receiver. This generally involves manually setting or turning on an AFC switch for listening to the received program after tuning in a station, and again manually turning off the AFC switch when retuning for another signal or station with proper accuracy for good sound reproduction. The switching operation thus involves a "Normal" or "Off" position of AFC switch means for tuning, and an "AFC" or "On" position of the switch means for continued signal reception or listening.

However, when, after listening to a program from one station or at one signal frequency in the AFC position or operating condition, it is desired to tune to a different program or station, the AFC position or operating condition may be, and most often is, inadvertently maintained, thereby preventing peak tuning to the signal frequency the newly selected station. It is desirable, therefore, to provide means for disengaging or cutting off the AFC control automatically in response to retuning of the receiver, thereby permitting proper tuning without requiring any thought or action on the part of the user to avoid inadvertently maintaining the AFC control during the tuning.

It is, therefore, an object of this invention to provide an improved tuning control system for frequency-modulation radio receivers and the like, with automatic frequency control, which is of simplified low-cost construction and readily applicable to automatic-frequency-control circuits of the on-off switching type.

It is also an object of this invention to provide an improved tuning control system for frequency-modulation radio receivers and the like, with automatic frequency control, which provides convenient AFC lock-on means for use after tuning to a selected signal, and automatic AFC unlock or release upon resuming the tuning operation for further signal selection.

It is also a further object of this invention to provide a tuning control system as above described which provides pushbutton control for the AFC lock-on means and automatic AFC unlock or release upon resuming tuning operation by movement of a manual tuning control element in either direction of rotation from a tuned-in position.

In accordance with one embodiment of the invention, a frequency-modulation radio receiver, having a tuner provided with a rotary tuning shaft, is provided also with an automatic-frequency-control circuit including an AFC ON-OFF switch. Control means for the tuning control system of the receiver includes a driving element, such as a manual tuning control element or knob connected with, and in the present example mounted on, a tubular tuning control shaft which is connected to drive the rotary tuning shaft of the tuner. The tubular tuning control shaft carries at its inner end a circular clutch member which rotates with the driving means or control knob to drive a second clutch member for the AFC release means hereinafter described.

The AFC ON-OFF switch is actuated by push-button motion applied thereto through an operating rod mounted coaxially with tubular tuning control shaft. A push-button knob on the outer end of the rod is closely associated with the tuning control knob of the present example, for convenience of operation, and when moved or pressed inwardly actuates the AFC switch through the operating rod, to the ON or AFC position against the force of return-spring means connected with the rod.

The rod is normally maintained in the latched or set position by the cooperative action of a pin or locking element on the rod and a rotatable and coaxially-movable locking-and-unlocking element or sleeve surrounding the rod and connected with the second clutch member. The operating rod and the pin are prevented from rotating with the sleeve by a fixed guide bearing with a rectangular guide slot for the rear end of the operating rod, which is a rectangular or flat blade haveing a sliding fit in the guide slot. The forward or main section of the switch operating rod is round in cross-section to provide a suitable bearing for the rotatable and axially-movable locking-and-unlocking element or sleeve.

The sleeve is resiliently maintained in a reference position of rest for limited axial and rotatable movement in either direction, by radially-acting tension-spring or aligning means connected therewith. In the rest position of the sleeve, a rearwardly-projecting finger or stud thereon is presented and aligned with the pin on the switch rod, so that as the switch rod is moved by the push-button means to the ON or AFC position, the sleeve stud is moved into the path of movement of the pin and prevents return movement of the rod. The switch is thus locked in the ON or AFC position. In the sleeve a pair of parallel axially-extending slots are provided, one on each side of the stud, and are each sufficiently wide to receive the pin with a smooth sliding fit, when the pin is disengaged from the stud.

When engaged with the end of the stud, the pin automatically drives or moves the sleeve and second clutch plate axially, by force of the return-spring means on the rod, to cause the clutch plates to engage. Thus, upon resuming the tuning operating by rotating the driving means or control knob in either direction, the sleeve is rotated against the force of the aligning spring means therefor and carries the stud out of alignment with the pin which then drops into and moves through the associated slot to a fixed stop position. The AFC switch is thereby opened and the tuning is released, automatically and without thought or action on the part of the user of the receiver, for normal peak tuning without AFC control. Upon completing the tuning operation, the AFC knob is depressed to close the AFC switch. The locking pin then moves rearwardly from the slot and the force of the aligning spring rotates the sleeve, as above noted, to the normal position with the stud aligned with the pin, thereby locking the pin and the rod against return movement and maintaining the AFC switch in the ON position, for AFC control and improved frequency response from the receiver.

Thus, the tuning control system for automatic frequency control is readily adapted for use with present commercial forms of FM receivers without involving complicated structural changes or appreciable cost. The system automatically prevents having the AFC circuit inadvertently in operation, with consequent loss of peak tuning, through the failure to disengage the AFC switch. With this system, as soon as the rotary tuning element is moved in either direction for tuning to a different signal or station, the AFC switch is automatically returned to the OFF or NORMAL position.

The invention will, however, be better understood from the following description when considered in connection with the accompanying drawings illustrating certain embodiments thereof, and its scope is pointed out in the appended claims.

In the drawings, FIGURE 1 is a schematic circuit diagram of a frequency-modulation radio receiver with automatic frequency control, provided with a manual tuning control system embodying the invention;

FIGURE 2 is a side view in elevation, and partly in section, of the tuning control system shown in FIGURE 1, further showing the actual structural relation of the parts thereof;

FIGURES 3–8, inclusive, are views in perspective of certain operating elements of the tuning control structure shown in FIGURE 2, further illustrating certain features thereof;

Figure 1:
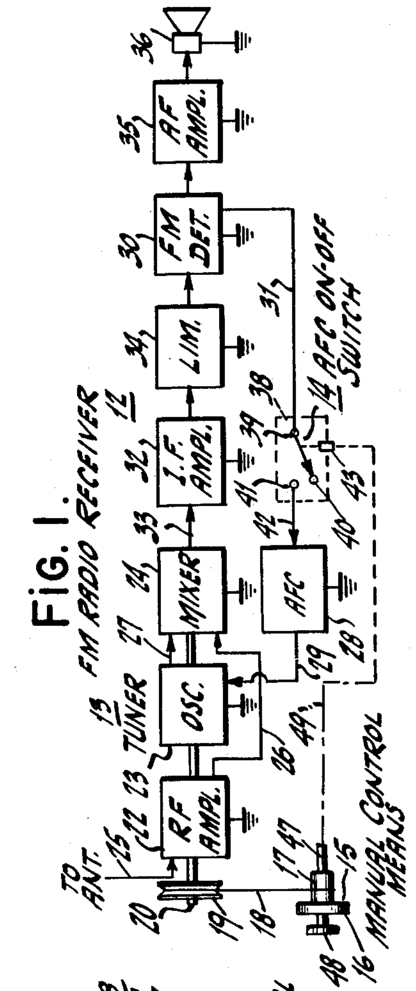
Figures 2, 3, 4, 5, 6, 7:
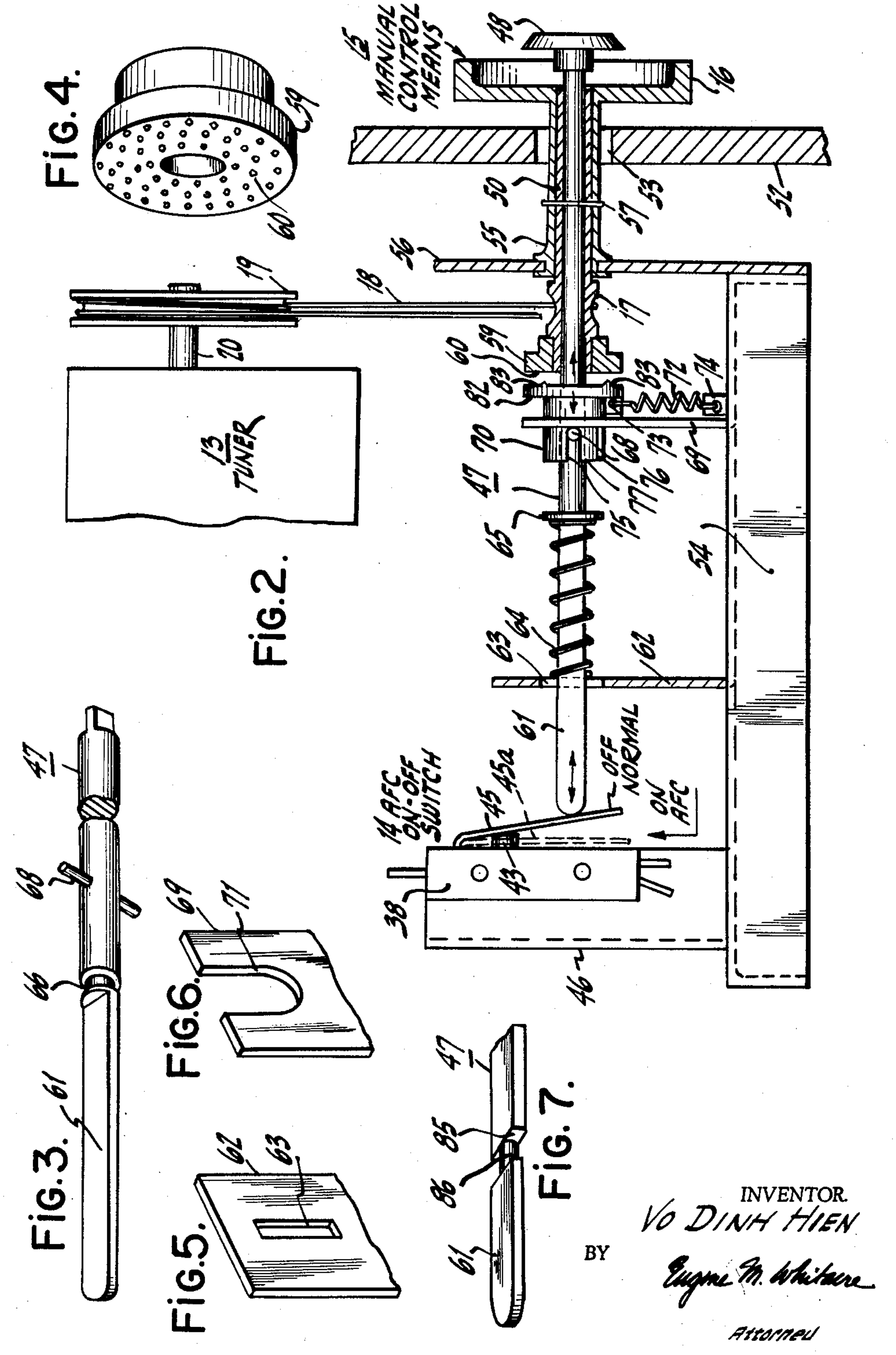

Referring to the drawings, wherein like parts throughout the various figures are designated by like reference characters, and referring in particular to FIGURES 1 and 2, a frequency-modulation radio receiver 12 is provided with a tuner 13, an AFC on-off or control switch 14, and manual control means 15 for tuning an AFC. The latter includes a rotary manual tuning control knob 16 which drives a cord spool or spindle element indicated at 17, in turn connected through cord drive means 18 with a grooved drive pulley 19 on a rotary tuning shaft 20 of the tuner 13.

The tuner comprises an input R-F amplifier 22, an oscillator 23 and a mixer stage 24, all tunable jointly through the broadcast FM band by rotation of the common rotary tuning shaft 20 of the tuner. The RF amplifier is connected to an antenna or like signal source through an input signal supply line 25, and is connected to the mixer stage 24 through an output circuit indicated at 26. The oscillator is also coupled to the mixer stage as indicated by the coupling connection 27, and is further placed under control of AFC means or circuit 28 connected therewith through an AFC input circuit connection indicated at 29.

The AFC means or circuit 28 is supplied with signal-responsive control voltage from any suitable source, such as the FM detector indicated at 30, and is connected therewith through an AFC voltage supply circuit 31 and the AFC switch 14. The remainder of the receiver may be conventional and includes the usual I-F amplifier 32 connected with the output circuit 33 of the mixer stage 24, a limiter stage 34 interposed between the I-F amplifier and the FM detector 30, and the usual A-F amplifier 35 and output sound reproducing means or loudspeaker 36.

The AFC switch 14 includes a casing 38 mounted in fixed position in the receiver, and is of the two-point type having a movable switch arm or contact 39 connected with the AFC supply circuit 31, a first or open contact 40 to which the arm 39 is resiliently biased to move, and a second or closed contact 41 connected with the AFC circuit 28 through a circuit connection indicated at 42. The AFC switch is thus normally "open" or OFF, and is operated or moved to the "closed" or ON position by an externally-projecting push button 43 connected internally with the switch arm 39 and an external switch operating lever 45 mounted, as shown in FIGURE 2, to engage the outer end of the button 43. As indicated, the switch operating lever 45 is moved from the OFF or NORMAL position shown, to the position 45A, indicated in dotted outline, at which the switch is moved to the ON or AFC position. With reference to the circuit of FIGURE 1, this operation causes the switch arm to move from the contact 40 to the contact 41.

The AFC switch is mounted in a fixed position in the control system, for example with the casing 38 fixed to a supporting bracket 46, and is operated by an axially-movable rod 47, the inner rounded end of which is in contact with the switch operating lever 45 as shown in FIGURE 2. The switch operating rod 47 extends coaxially through the tuning control knob and cord drive means between the switch lever and an external push button or switch operating knob 48 mounted thereon coaxially and in close spaced relation to the tuning control knob 16, this operating connection to the switch 14 being indicated in FIGURE 1 by the dash-and-dot line 49.

Referring now to FIGURES 3–6, inclusive, along with FIGURE 2, the switch operating rod 47 is essentially round in cross section and provides a bearing section which fits freely within an elongated tubular control shaft 50. The tuning control knob 48, the tubular tuning control shaft 50 on which the knob is mounted, and the switch operating rod 47 are arranged in coaxial concentric relation as indicated. The operating knob or push button 48 on the outer end of the switch operating rod 47 and the tuning control knob at the outer end of the shaft 50 are thus positioned in close concentric relation for convenience of operation.

In the present example, the tuning control knob and push button are in front of the receiver control panel, indicated at 52, with the control shaft and rod extending through an opening 53 therein from the apparatus chassis or mounting means 54 from which they are rigidly supported. For this purpose the control shaft is mounted for rotation in a tubular sleeve bearing 55 which is secured in a supporting panel or plate 56 mounted on the base 54 and extending vertically therefrom as shown in FIGURE 2.

The tubular bearing 55 provides sufficient length and bearing surface to permit the tubular tuning control shaft 50 to rotate smoothly therein in response to rotation by the tuning control knob 16. The shaft 50 is prevented from longitudinal movement in one direction by the shouldered configuration of the cord-drive spool 17 which is integral with the shaft in the present example. In the opposite direction, the shaft 50 is prevented from moving axially by a C-washer 57 which operates in connection with a groove (not shown) in the shaft.

The inner end of the tubular tuning control shaft is provided with a circular clutch element or plate 59 which rotates therewith. The clutch plate has a flat clutch face 60 provided with suitable indentations, as indicated, for increasing the frictional effect thereof in operation, as will hereinafter appear. The clutch element 59 may be constructed of any suitable material such as molded plastic, whereas the tuning control shaft is preferably of metal such as steel or aluminum. Both the tuning control knob 16 and the push-button knob 48 may be also made of molded plastic material.

The switch operating rod 47 is fixed against rotation but is movable longitudinally or axially for operating the AFC switch, and is adapted to be locked in the ON position. It is released automatically in response to rotation of the tuning control knob in either direction. To hold the rod against rotation, it is provided with a rectangular or flat blade section 61 at its rear or inner end, as indicated more clearly in FIGURE 3. A fixed guide bearing plate or bracket 62 for the switch operating rod is provided with a rectangular guide slot 63 for receiving the blade section of the rod with a smooth sliding fit. In the present example, the guide bearing plate or bracket element is connected with the base, and may be struck up therefrom integrally, as indicated in FIGURE 2, substantially midway between the AFC switch and the round or main section of the switch operating rod.

The switch operating rod 47 is provided with a retracting or return spring 64 connected therewith to bias said rod to move axially or longitudinally in a direction to release the AFC switch, which is, in the present example, forwardly or frontly, and to the right as viewed in FIGURE 2. The spring is preferably a coiled compression spring, as indicated, surrounding the rod and compressed between the guide bearing bracket 62 and a C-washer 65 with seats in a circular slot 66 in the rod 47 in front or forward of the blade section 61.

Also carried by the switch operating rod 47 is a transverse stop or locking pin 68 which is positioned to engage a second plate or bracket 69, spaced from the first bracket 62 and aligned therewith along the operating rod. The bracket 69 acts as stop means for the stop pin 68 to hold the operating rod in its forward position against the biasing force of the retracting or return spring 64, with the AFC switch in its OFF or NORMAL position as indicated in FIGURE 2. In this position, the operating button 48 is in its forward position and the AFC switch is "open." The AFC action in the receiver is thus cut off for permitting effective and sharp tuning operation by rotation of the control knob 16.

In association with the locking or stop pin 68, the switch operating rod carries a movable switch locking-and-unlocking element or sleeve 70. The sleeve is provided with a clearance slot 71 in the stop pin bracket 69, as indicated more clearly in FIGURE 6, and is normally free to rotate on the switch rod and to move axially thereon in either direction, as indicated by the arrowed lines shown in FIGURE 2. The rotation and axial movement is limited and controlled, and is made with reference to a normal position of rest, by an aligning spring 72 which extends in a radial direction from the sleeve, in connection with an integral lug 73 thereon, to a fixed support as provided by a similar lug 74 on the base 54. The aligning spring in the present example is of the helical tension type adapted for resiliently biasing the sleeve 70 to the position shown in FIGURE 10.

Figure 8:
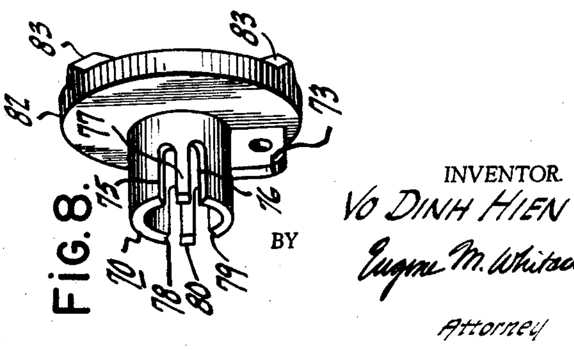

With the AFC OFF, the stop pin 68 lies in a longitudinally-extending slot 75 in the sleeve 70 without contacting the bottom thereof as it lies against the stop bracket 69. Referring to FIGURE 8 along with FIGURE 2, it will be seen that a second elongated slot 76 is provided in the sleeve 70 and spaced in substantially parallel relation to the first slot 75, thereby providing between them effectively a rearwardly extending stud or stop finger 77. Both slots are of the same width and length to provide a free sliding fit with the pin 68 or the one radially extending end thereof. The stop pin may thus consist of but one radially-extending end.

The stop pin may also extend diametrically through the operating rod 47 to the opposite side, as shown, to operate in conjunction with a second and similar set of slots 78 and 79 and a stud or stop finger 80 provided in the sleeve diametrically opposite to the first stud and slots described. Thus the elongated slot 78, operating with the slot 76 as a pair, is provided for the opposite end of the pin 68, and likewise the elongated slot 79 is provided, in cooperation with the slot 75 as a pair, for receiving the pin 68 when the latter is provided with radial extensions on both sides of or extends diametrically through, the rod as in the present example. Between the slots 78 and 79, the diametrically-opposite stud or stop finger 80 is provided with respect to the stud or stop finger 77.

The switch locking-and-unlocking element or sleeve 70 is further provided with a circular clutch element or plate 82, coaxial and preferably integral therewith as shown. The sleeve and clutch plate may then be molded in one piece of plastic material, and the plate is preferably provided with forwardly-extending radial rib elements 83. The clutch elements 59 and 82 are adapted to engage and the rib elements 83 to frictionally engage the face 60 of the clutch element 59 attached to the tuning control shaft 50. The sleeve may be driven thereby in a rotational direction as will hereinafter appear. In the present example, it may be assumed that there are four spaced radial rib elements on the movable clutch element 82.

When the AFC switch is in the OFF or NORMAL position as shown in FIGURE 2, the switch operating rod 47 is held in the forward position, with stop pin 68 in contact with the stop plate or bracket 69 and lying in one of the slots, or pairs of slots, as above pointed out, whereby the clutch element or plate 82 is retracted from contact with the clutch plate 59. The tuning, through the driving connection with the tuner and shaft 20, is thus free from mechanical interference, due to the spacing of the clutch members 83 and 59. The clutch member 59 thus rotates free in connection with the tuning knob 16 and the tuning control shaft 50 when accurately tuning in a frequency-modulation signal or station, with the AFC control off.

Following the tuning operation, the AFC switch is then operated by depressing the push button 48 to move the switch operating rod inwardly, or to the left as viewed in the drawing, whereby the switch operating lever is moved to the position 45A to turn on the AFC control. The switch may be retained in this position by a simple modification of the operating rod, thereby to maintain the AFC control for all tuning, if desired. This may be provided by a notch 85 (see FIGURE 7) on opposite sides of a central round pivot or reduced section 86 in the thin flat blade section 61 of the switch operating rod at a point opposite the rectangular guide slot 63 when the AFC switch is closed, with the operating button 48 pressed all the way in. The notch 85 is of greater width than the thickness of the guide bracket 62 and is aligned therewith so that the rod 47 may be rotated on the section 86 by the knob 48, a quarter turn, to lock the rod in position in contact with the bracket at the guide slot 63. The diameter of the reduced section 86 of the rod in the notch is equal to the thickness of the blade section 61 and is thus slightly smaller than the width of the guide slot 63, whereby the rod may freely turn at the guide slot.

Due to the rectangular cross section of the blade section the switch operating rod is locked against the bracket 62 and does not disturb the spaced relation between the clutch elements 83 and 59, while maintaining the switch in the closed or ON position for continued AFC operation. Thus the tuning will remain free from mechanical interference while maintaining AFC operation, should this be desirable, as in fringe areas. The switch may be released to reopen at any time by turning the knob 48 a quarter turn in either direction.

Figure 9:
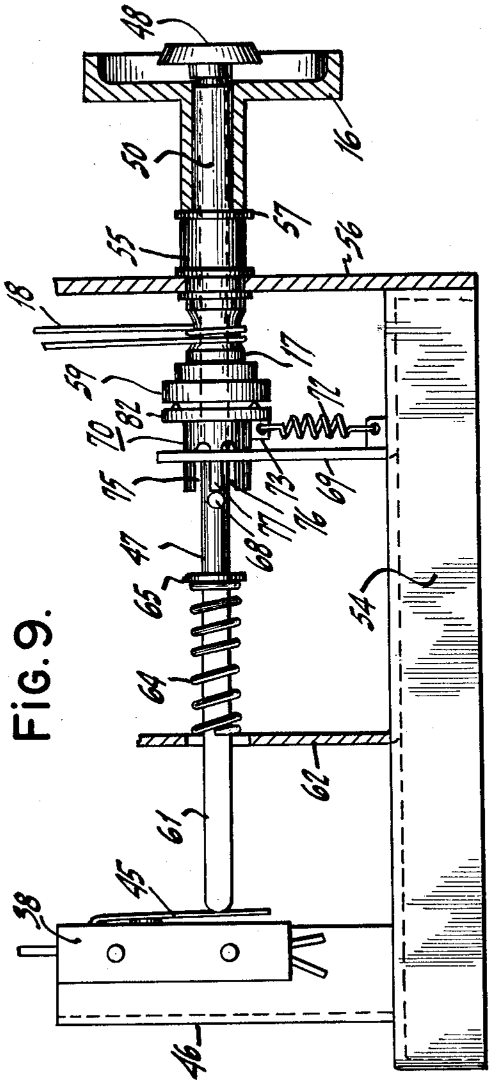
FIGURE 9 is a side view in elevation, and partly in section, of a portion of the tuning control structure shown in FIGURE 2 with certain of the elements thereof in different operating positions.
Figure 11:
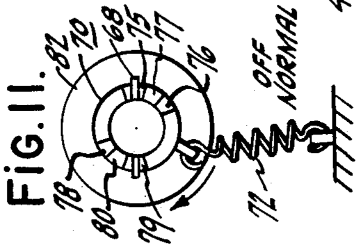
FIGURES 10 and 11 are rear end views of certain operating elements of the structure of FIGURES 9 and 2 in the respective operating positions shown therein, further illustrating the operation of the system.
Figure 10:
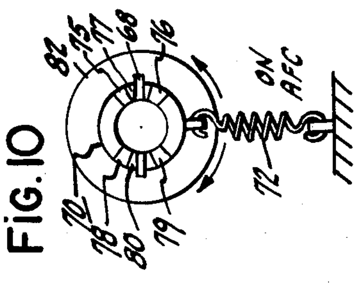

The operation of the switch locking-and-unlocking element or sleeve 70 will now be considered with reference to FIGURES 9, 10 and 11 along with FIGURE 2 and the preceding figures. When the push button 48 is fully depressed to set the AFC switch to the ON position, the locking or stop pin 68 in the operating rod 47 moves rearwardly and out of the slot, or diametrically opposite pairs of slots, and into the fully released position shown in FIGURE 9. The normal position of rest for the rotary and axially-movable sleeve, or locking-and-unlocking element, 70 is as indicated in FIGURES 9 and 10, with the stud 77, and its counterpart 80, in alignment with the stop pin 68, and with the sleeve 70 held in the rest position by the radial holding force of the aligning spring 72. The sleeve may be rotated in either direction therefrom as indicated by the arrowed lines in FIGURE 10 but, in the rest or mid-position, the switch remains closed (ON) for AFC operation and better listening without tuning readjustment, on any particular station or signal tuned in.

Because of the retracting force of the return spring 64 on the switch operating rod 47, the latter is biased toward the OFF position which brings the stop pin 68 to bear against the stud or stud elements of the sleeve 70. This action moves the sleeve and connected clutch element 82 along the operating rod axially against the restoring force of the aligning spring 72 and brings the clutch element 82 into contact with the clutch element 59. The radial friction ribs 83 of the clutch element 82 provide frictional contact with the clutch face 60 of the clutch element 59 and the clutch means is closed. The rotary locking-and-unlocking sleeve 70 is thus mechanically connected for rotation by and with the tuning control knob 16.

When tuning is resumed and the tuning knob 16 is rotated in either direction, the frictional force between the clutch elements is sufficient to overcome the friction between the stop studs or studs and the stop pin 68 and to drive or rotate the sleeve 70 in the same direction, thereby releasing the pin to fall or move forward in the slot, or the slots which are diametrically opposite in pairs, under the driving action of the return spring 64, until the pin strikes the stop bracket 69 and the switch opens to cut off the AFC action automatically without the attention of the operator in the matter of releasing the AFC control. The tuning then continues with clutch means open, and free to provide a signal with sharp tuning as is desirable.

The rectangular guide slot 63 in the guide bearing bracket 62, in cooperation with the flat blade section 61 of the switch operating rod 47, prevents the latter from turning and maintains the stop pin 68 in a fixed position against rotation as the sleeve and the stop studs 77 and 80 rotate with respect thereto in the switch releasing action above described. The AFC switch is thus automatically returned to a normal position for manual tuning.

In the tuning control system of the present example, when the tuning control knob is turned for selecting a new signal or station, and the switch is released, the stop pin 68 enters the slots 75 as indicated in FIGURE 11, thereby holding the aligning spring 72 under increased tension. This creates a restoring force tending to rotate the sleeve back to the position of FIGURE 10. The pin 68 and the rod 47 are held against rotation by the blade section 61 in the slot 63 in the bearing plate 62. The position of the pin and the sleeve in FIGURE 11 corresponds to that shown in FIGURE 2, with the AFC switch open.

When the desired signal or station is tuned accurately, the button 48 is again depressed to move the pin out of the slot or slots, thereby releasing the sleeve from the position shown in FIGURE 11 and permitting the aligning spring to rotate it back to the position shown in FIGURE 10. The pin and studs are once more aligned for stopping and holding the switch operating rod in the AFC or ON position shown in FIGURE 9. The station or signal is thus locked on AFC for listening and will remain so until the tuning knob is again turned for tuning change.

Due to the radial pull of the aligning spring on the switch locking-and-unlocking sleeve 70, the stud or studs 80 are always accurately aligned with the stop pin 68 on the switch rod in the position of rest. The sleeve 70 and its stud or studs can be moved in either of the directions indicated by the arrowed lines in FIGURE 10. The position to the left as indicated by arrowed line in FIGURE 11 is, therefore, shown only by way of example. The pressure of the retracting spring 64 acts axially or longitudinally and thus the sleeve may be turned in either direction to release the pin from the stud or studs and into the slot or slots. Likewise, it will be seen that the stop pin 68 may protrude radially on both sides of the rod or only on one side, in which case a single stud and two associated elongated slots may be used.

For balanced operation, the dual stud and quadruplex slot construction is at present preferred. Thus in the present example, two pairs of diametrically opposed slots 76–78 and 75–79, are provided in the sleeve and extend longitudinally of the sleeve in parallel relation on opposite sides of two diametrically opposed studs 77 and 78. The studs, or stop fingers as they may be considered, extend rearwardly and align with the locking or stop pin on the switch operating rod to hold it in the inwardly depressed or AFC–ON position of the rod.

Thus when the tuning knob is turned in either direction as the tuning operation is resumed, the AFC switch operating rod unlocks and moves to the OFF position automatically. After completing the tuning, the AFC is again switched on for extended listening to a program. The system thus provides simplified, highly effective and convenient AFC lock-on means for use after each tuning operation in frequency-modulation receivers, and automatic AFC unlock or release upon resuming manual tuning operation in either direction of rotation of the manual tuning control element.

The manual tuning control system of the present invention for radio receivers and the like, with automatic frequency control, relieves the operator from disengaging the AFC. As soon as the tuning knob or element is turned in either direction for tuning a different station or signal, the AFC control switch is automatically returned to the NORMAL or OFF position. Thus combined tuning control and automatic AFC unlock means for frequency-modulation radio and the like receivers, having automatic frequency control and off-on switching means therefor, is provided by a simplified and low-cost control structure adapted for use with conventional tuning control elements.

What is claimed is:

1. A tuning control system for signal receivers with automatic frequency control comprising in combination:
- a rotary tuning control shaft,
- a switch operating rod extending coaxially through said control shaft and movable axially thereof,
- resilient means connected for biasing said rod axially in one direction,
- an automatic-frequency-control switch connected with said rod for operation thereby to an automatic-frequency-control position,
- a sleeve element rotatable on said rod and having a locking element,
- a pin on said rod meeting and engaging said locking element to lock said pin and rod and hold the switch in the automatic-frequency-control position,
- clutch means connected for engaging and rotating said sleeve in response to rotation of said control shaft to release said locking element from said pin, thereby to release said switch from the automatic-frequency-control position, and
- means connected with said sleeve for imparting resilient rotational restoring force thereto tending to move said sleeve to the locking position for said pin and switch operating rod.

2. A tuning control system for signal receivers with automatic frequency control comprising in combination:
- a tuning control shaft mounted for rotation in fixed bearing means,
- rotary control means connected for driving said tuning control shaft,
- a switch operating rod extending coaxially through said control shaft and movable axially thereof,
- means on one end of said rod for manually imparting axial movement thereto in one direction,
- resilient operating means for axially biasing said rod in the opposite direction, automatic-frequency-control means including a switch connected with the opposite end of said rod for operation thereby to the closed position in response to movement in said one direction, a sleeve element rotatable on said rod and having a stop stud extending along said rod on one side thereof, a pin on said rod meeting and engaging said stud to lock said pin and rod and hold the switch in the closed operative position, clutch elements carried by said tuning control shaft and said sleeve for engaging and rotating said sleeve in response to rotation of said control means to release said stud from said pin thereby to open said switch, and spring means connected with said sleeve and extending radially therefrom for imparting resilient rotational and axial restoring force to said sleeve tending to move said sleeve to the locking position for said pin and switch operating rod and to move the clutch elements into disengagement.

3. In a signal receiver with automatic frequency control, a tuning control system comprising in combination:

a signal tuner having a rotary tuning shaft, a rotary tubular tuning control shaft connected to drive said tuning shaft, rotary control means connected for driving said tuning control shaft, a switch operating rod extending coaxially through said control shaft and movable axially thereof, push button means connected with said rod for manually imparting axial movement thereto in one direction, resilient operating means connected with said rod for imparting axial movement thereto on the opposite direction, automatic-frequency-control means including a control switch connected with said rod for operation thereby to apply automatic-frequency-control to said receiver in response to movement in said one direction, a locking-and-unlocking sleeve rotatable on said rod and having a locking element, a pin on said rod meeting and engaging said locking element to lock said pin and rod and hold the switch in the automatic-frequency-control position, clutch means including clutch member carried by said sleeve tuning control shaft for engaging and rotating said sleeve in response to rotation of said control means to release said locking element from said pin thereby to open said switch to cutoff the automatic-frequency-control, and spring means connected with said sleeve and extending radially therefrom for imparting resilient rotational and axial restoring force to said sleeve tending to move said sleeve to the locking position for said pin and switch operating rod and to the clutch elements into disengagement.

4. In a signal receiver with automatic frequency control, a tuning control system comprising in combination:

a tuner having a rotary tuning shaft, a tubular tuning control shaft mounted for rotation in fixed bearing means and connected to drive said tuning shaft, rotary control means connected for driving said tuning control shaft, a first circular clutch plate carried by said tuning control shaft, a switch operating rod extending coaxially through said control shaft and movable axially thereof, push-button means on one end of said rod for manually imparting axial movement thereto in one direction, resilient operating means connected with said rod for imparting axial movement thereto on the opposite direction, a flat blade element and fixed guide bearing means therefor at the opposite end of said rod for preventing rotational movement thereof, automatic-frequency-control means including a switch connected with said opposite end of said rod for operation thereby to the closed position in response to movement in said one direction, a locking-and-unlocking sleeve rotatable on said rod and having at least one stop element extending along said rod in said one direction, a pin on said rod meeting and engaging said stop element to lock said pin and rod and hold the switch in the closed operative position, said resilient operating means being thereby effective to move said sleeve in said opposite direction, a second circular clutch plate carried by said sleeve for engaging said first clutch plate in response to said movement of said sleeve, whereby said sleeve rotates in response to rotation of said control means to release said stud from said pin and open said switch, and spring means connected with said sleeve and extending radially therefrom for imparting resilient rotational and axial restoring force to said sleeve tending to move said sleeve to the locking position for said pin and switch operating rod and to move the second clutch plate into disengagement from the first clutch plate.

5. In a radio receiver having automatic frequency control, a tuning control system comprising in combination:

a tuner having a rotary tuning shaft, a tubular tuning control shaft mounted for rotation in fixed bearing means and connected to drive said tuning shaft, an outer rotary control knob mounted on said tuning control shaft, a first clutch member carried by the shaft for rotation therewith, a switch operating rod extending coaxially through said control shaft and resiliently movable axially thereof in one direction, said rod having an inner blade-like end and having an outer end extending through said control knob, fixed guide bearing means for said inner end of the switch operating rod, outer push-button control means coaxial and in close operative relation with said control knob on said outer end of the switch operating rod for manually imparting axial movement thereto in said one direction, automatic-frequency-control lock-on means including an automatic-frequency-control switch connected with said inner end of said rod for operation thereby to the automatic-frequency-control position in response to movement thereof in said one direction, a locking-and-unlocking sleeve rotatable on said rod and having a stop element extending along said rod on one side thereof, a transversely extending locking pin on said rod meeting and engaging said stop element to lock said pin and rod and hold said switch in the automatic-frequency-control position, a second clutch member on said sleeve for engaging said first clutch element in response to resilient axial movement of said rod in said one direction and rotating said sleeve in response to rotation of said control knob to release said stop element from said pin, thereby to open said switch to cutoff automatic-frequency-control of said receiver, and an aligning tension spring connected with said sleeve and extending radially therefrom for imparting resilient rotational and axial restoring force to said sleeve to move said sleeve to the locking position for said pin and switch operating rod and said second clutch member out of engagement with said first clutch member.

6. In a radio receiver having automatic frequency control, a tuning control system comprising in combination:

a tuner having a rotary tuning shaft, a tubular tuning control shaft mounted for rotation in fixed bearing means and connected to drive said tuning shaft, automatic-frequency-control means including an automatic-frequency-control switch, a switch operating rod extending coaxially through said control shaft and resiliently movable axially thereof in one direction to operate said switch, outer push-button control means on said switch operating rod for manually imparting axial movement thereto in said one direction, locking-and-unlocking means for said rod including a locking pin on said rod and a sleeve rotatable on said rod to different angular positions and having a stop element movable therewith, said sleeve having a normal position in which said rod meets and engages said stop element to lock said pin and rod and hold said switch in the operative automatic-frequency-control position, clutch means connecting said tuning control shaft and said sleeve for rotating said sleeve in response to rotation of said tuning control shaft and releasing said stop element from said pin, thereby to open said switch to cutoff automatic-frequency-control of said receiver, and an aligning tension spring connected with said sleeve and extending radially therefrom for imparting resilient rotational and axial restoring force to said sleeve to move said sleeve to the locking position for said pin and switch operating rod and to open said clutch means.

7. A tuning control system for frequency-modulation signal receivers with automatic frequency control comprising in combination:

a rotary tubular control shaft, rotary control means connected for driving said tuning control shaft, a switch operating rod extending coaxially through said control shaft and resiliently movable axially thereof in one direction, means connected with said rod for manually imparting axial movement thereto in the opposite direction, an automatic-frequency control switch connected with said rod for operation thereby in response to movement in said last-named direction, a locking-and-unlocking sleeve rotatable on said rod and having a first locking element, a second locking element on said rod meeting and frictionally contacting said first locking element to lock said pin and rod against resilient movement in said one direction and hold the switch in the automatic-frequency-control position, and clutch means carried jointly by said sleeve and tuning control shaft for frictionally engaging and rotating said sleeve in response to rotation of said control means to overcome the frictional contact and release said first locking element from said second locking element, thereby to release said rod and open said switch to cutoff the automatic-frequency-control.

References Cited in the file of this patent

UNITED STATES PATENTS

| | | |
|---|---|---|
| 2,389,213 | Schwarz | Nov. 20, 1945 |
| 2,560,312 | Tellier | July 10, 1951 |
| 2,788,668 | Sperber | Apr. 16, 1957 |
| 2,938,392 | Lyman | May 31, 1960 |
| 2,958,771 | Mural et al. | Nov. 1, 1960 |

UNITED STATES PATENT OFFICE

CERTIFICATE OF CORRECTION

Patent No. 3,166,714 January 19, 1965

Vo Dinh Hien

It is hereby certified that error appears in the above numbered patent requiring correction and that the said Letters Patent should read as corrected below.

Column 4, line 29 and column 12, line 1, after "tubular", each occurrence, insert -- tuning --.

Signed and sealed this 6th day of July 1965.

(SEAL)
Attest:

ERNEST W. SWIDER
Attesting Officer

EDWARD J. BRENNER
Commissioner of Patents